(12) United States Patent
Holland et al.

(10) Patent No.: US 11,721,721 B2
(45) Date of Patent: Aug. 8, 2023

(54) GERMANIUM NITRIDE LAYERS ON SEMICONDUCTOR STRUCTURES, AND METHODS FOR FORMING THE SAME

(71) Applicant: Taiwan Semiconductor Manufacturing Co., Ltd., Hsinchu (TW)

(72) Inventors: Martin Christopher Holland, San Jose, CA (US); Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 228 days.

(21) Appl. No.: 17/340,240

(22) Filed: Jun. 7, 2021

(65) Prior Publication Data

US 2021/0296442 A1 Sep. 23, 2021

Related U.S. Application Data

(60) Continuation of application No. 16/722,374, filed on Dec. 20, 2019, now Pat. No. 11,031,468, which is a
(Continued)

(51) Int. Cl.
*H01L 21/02* (2006.01)
*H01L 29/06* (2006.01)
(Continued)

(52) U.S. Cl.
CPC ...... *H01L 29/0673* (2013.01); *H01L 21/0228* (2013.01); *H01L 21/02112* (2013.01); *H01L 21/02271* (2013.01); *H01L 21/02381* (2013.01); *H01L 21/02532* (2013.01); *H01L 21/02603* (2013.01); *H01L 29/1033* (2013.01); *H01L 29/16* (2013.01); *H01L 29/42364* (2013.01); *H01L 29/42392* (2013.01); *H01L 29/518* (2013.01); *H01L 29/66439* (2013.01); *H01L 29/66795* (2013.01); *H01L 29/775* (2013.01);
(Continued)

(58) Field of Classification Search
CPC ... H01L 21/02381; H01L 29/0669–068; H01L 29/16; H01L 29/518
See application file for complete search history.

(56) References Cited

U.S. PATENT DOCUMENTS 9,236,267 B2  1/2016 De et al.
9,502,265 B1  11/2016 Jiang et al.
(Continued)

OTHER PUBLICATIONS

Maeda et al. "Role of germanium nitride interfacial layers in HfO2/germanium nitride/germanium metal-insulator-semiconductor structures¬,"Appl. Phys. Lett., 90:072911; Feb. 16, 2007 (Year: 2007).*

(Continued)

*Primary Examiner* — Daniel P Shook
(74) *Attorney, Agent, or Firm* — Slater Matsil, LLP

(57) ABSTRACT

Provided herein are semiconductor structures that include germanium and have a germanium nitride layer on the surface, as well as methods of forming the same. The described structures include nanowires and fins. Methods of the disclosure include metal-organic chemical vapor deposition with a germanium precursor. The described methods also include using a $N_2H_4$ vapor.

21 Claims, 13 Drawing Sheets

Related U.S. Application Data division of application No. 15/998,683, filed on Aug. 15, 2018, now Pat. No. 10,522,623.

(51) Int. Cl.
  H01L 29/10    (2006.01)
  H01L 29/78    (2006.01)
  H01L 29/16    (2006.01)
  H01L 29/66    (2006.01)
  H01L 29/51    (2006.01)
  H01L 29/423   (2006.01)
  H01L 29/775   (2006.01)

(52) U.S. Cl.
  CPC ........ *H01L 29/7827* (2013.01); *H01L 29/785* (2013.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2017/0117142 A1 | 4/2017 | Lee et al. |

OTHER PUBLICATIONS

Alvarez, Jr. et al., "Surface Passivation of New Channel Materials Utilizing Hydrogen Peroxide and Hydrazine Gas" Solid State Phenomena 255:31-35, 2016.

Jishiashvili et al., "Formation of Germanium Nitride Nanowires on the Surface of Crystalline Germanium" Journal of Nanoscience, Article ID 641734, 2013, 10 pages.

Lucien, "Thermal Decomposition of Hydrazine" Journal of Chemical and Engineering Data 6(4):584-586, 1961.

Yang et al., "Ab initio study on intrinsic defect properties of germanium nitride considered for gate dielectric" Applied Physics Letters 91:132906, 2007, 3 pages.

Yang et al., "Electronic structure of germanium nitride considered for gate dielectrics" Journal of Applied Physics 102:013507, 2007, 6 pages.

* cited by examiner

GERMANIUM NITRIDE LAYERS ON SEMICONDUCTOR STRUCTURES, AND METHODS FOR FORMING THE SAME

PRIORITY CLAIM

This application is a continuation of U.S. application Ser. No. 16/722,374, filed on Dec. 20, 2019, which is a divisional of U.S. application Ser. No. 15/998,683, filed on Aug. 15, 2018, now U.S. Pat. No. 10,522,623 issued on Dec. 31, 2019, each application is hereby incorporated herein by reference.

BACKGROUND

Semiconductor nanowires and fins, such as those including germanium, are used in a variety of device applications (e.g., in field effect transistors), and may include a surface passivation layer, which can be produced using several techniques. Previously used surface passivation layers are generally very thin (e.g., monolayer thickness) and may include materials that alter the electrical characteristics of the resulting device, for example, materials that have a lattice mismatch with the underlying semiconductor nanowire or fin, or materials that form a dipole at the interface between the passivation layer and the underlying semiconductor nanowire or fin.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
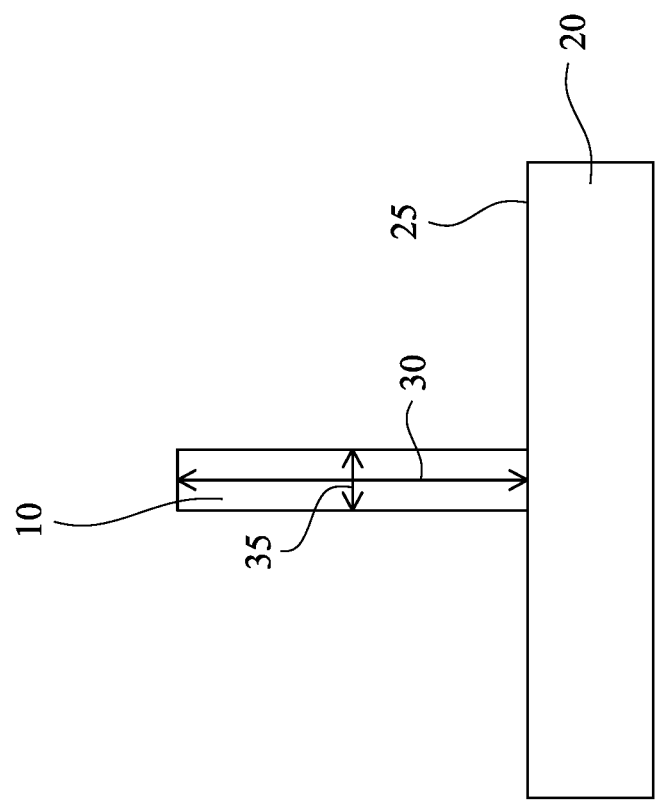
FIGS. 1A-1E illustrate a method for forming a germanium nitride layer on a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein include a germanium nitride ($Ge_3N_4$) layer on the surface of a semiconductor structure, e.g., a nanowire or fin, which comprises germanium (Ge). Such layers are more than a surface treatment, meaning that the germanium nitride layer is more than a monolayer thick. In embodiments, a germanium nitride layer is at least about 0.2 nanometers (nm) thick. "About," as used herein, denotes that the actual value may be somewhat more or somewhat less than the stated value or range, to within ±20% of the stated value. In embodiments, about means that the actual value is within ±15% of the stated value. In some embodiments, about means that the actual value is within ±10% of the stated value. In some embodiments, about means that the actual value is within ±5% of the stated value. In some embodiments, about means that the actual value is within ±1% of the stated value.

In various embodiments, a germanium nitride layer of this disclosure has a low carbon concentration, a low oxygen concentration, or both. Further, in some embodiments, an interface between a surface of a semiconductor structure and a germanium nitride layer has a low interface trap density ($D_{IT}$).

As described in more detail below, embodiments of the present disclosure include forming a semiconductor structure that comprises germanium, and forming a germanium nitride layer, which is more than a monolayer thick, on a surface of the semiconductor structure. In embodiments, the germanium nitride layer is formed using metal-organic chemical vapor deposition (MOCVD). In some embodiments, the vapor used in the MOCVD comprises $Ge_2H_6$, $N_2H_4$, or both.

Embodiments of the present disclosure include forming a germanium nitride layer on a semiconductor structure under conditions that avoid reflow of germanium in the semiconductor structure. Additionally, in some embodiments, methods of forming a germanium nitride layer described herein have substantially no inhibition time.

Figure 3:
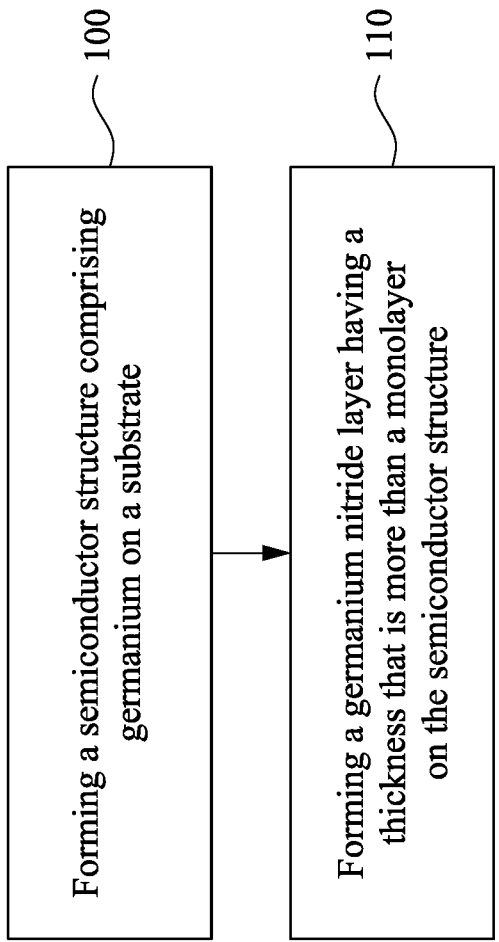
FIG. 3 illustrates an example fabrication process.

FIGS. 1A-1E illustrate steps of a method of the disclosure, in accordance with some embodiments of the present disclosure. FIG. 3 provides a flow chart that illustrates the steps of an illustrative method, in accordance with various embodiments of the present disclosure.

As shown in FIG. 1A, and as described in example operation 100 of FIG. 3, a semiconductor structure 10 (e.g., a nanowire or a fin) is formed. In embodiments, semiconductor structure 10 includes germanium. In some embodiments, semiconductor structure 10 includes silicon and germanium. In some embodiments, semiconductor structure 10 includes two or more sections of different materials. For example, a semiconductor structure may include a first section of germanium and a second section of silicon-germanium. In some embodiments, these different sections are stacked vertically (i.e., in a direction substantially perpendicular to the surface of the substrate on which the semiconductor structure is arranged). In other embodiments, these different sections are arranged horizontally (i.e., in a direction substantially parallel to the surface of the substrate on which the semiconductor structure is arranged).

In accordance with various embodiments of the current disclosure, semiconductor structure 10 is formed using any suitable method. Such methods include lithographic techniques (e.g., photolithographic) and epitaxial growth.

In further embodiments, a dopant is implanted into semiconductor structure 10, or a section thereof. In some embodiments, semiconductor structure 10, or a section thereof, is doped with n-type dopant(s). In some embodiments, semiconductor structure 10, or a section thereof, is doped with p-type dopant(s). Any suitable process may be used to implant such a dopant into a semiconductor structure, or a section thereof.

In some embodiments, semiconductor structure 10 is formed on a substrate 20. In some embodiments, semiconductor structure 10 is formed over a substrate 20. In some embodiments, semiconductor structure 10 is in contact with a substrate 20. In some embodiments, semiconductor structure 10 abuts a substrate 20. In other embodiments, semiconductor structure 10 is formed from a substrate 20. For example, a semiconductor structure 10 (e.g., a fin) may be formed by etching portions of a substrate 20 on either side of a semiconductor structure 10.

Any suitable substrate may be used in the devices and methods of this disclosure. In embodiments, substrate 20 is a semiconductor material, e.g., silicon (Si), germanium, a silicon-germanium alloy, and the like. In some embodiments, the substrate 20 may comprise a compound semiconductor including Group Iv-Iv compound semiconductors such as SiC and SiGe, Group III-v compound semiconductors such as GaAs, GaP, GaN, InP, InAs, InSb, GaAsP, AlGaN, AlInAs, AlGaAs, GaInAs, GaInP, and/or GaInAsP; or combinations thereof. In embodiment, the substrate 20 is a silicon layer of an SOI (silicon-on insulator) substrate. Amorphous substrates, such as amorphous Si or amorphous SiC, or insulating material, such as silicon oxide may also be used as the substrate 20. The substrate 20 may include various regions that have been suitably doped with impurities (e.g., p-type or n-type conductivity). In embodiments, substrate 20 is a p-type silicon substrate with an impurity concentration in a range of about $1\times10^{15}$ cm$^{-3}$ to about $2\times10^{15}$ cm$^{-3}$. In other embodiments, the substrate 20 is an n-type silicon substrate with an impurity concentration in a range of about $1\times10^{15}$ cm$^{-3}$ to about $2\times10^{15}$ cm$^{-3}$. In some embodiments, substrate 20 includes the same material as semiconductor structure 10.

In embodiments, a semiconductor structure 10 is a fin, as shown in FIG. 1A. In other embodiments, a semiconductor structure 10 is a nanowire.

In some embodiments, a semiconductor structure 10 is a vertical semiconductor structure, i.e., a semiconductor structure that extends away from a surface 25 of the substrate by a height 30 that is greater than the width 35 of the semiconductor structure. In some embodiments, a vertical semiconductor structure is a vertical nanowire. In other embodiments, a vertical semiconductor structure is a fin.

Figure 1B:
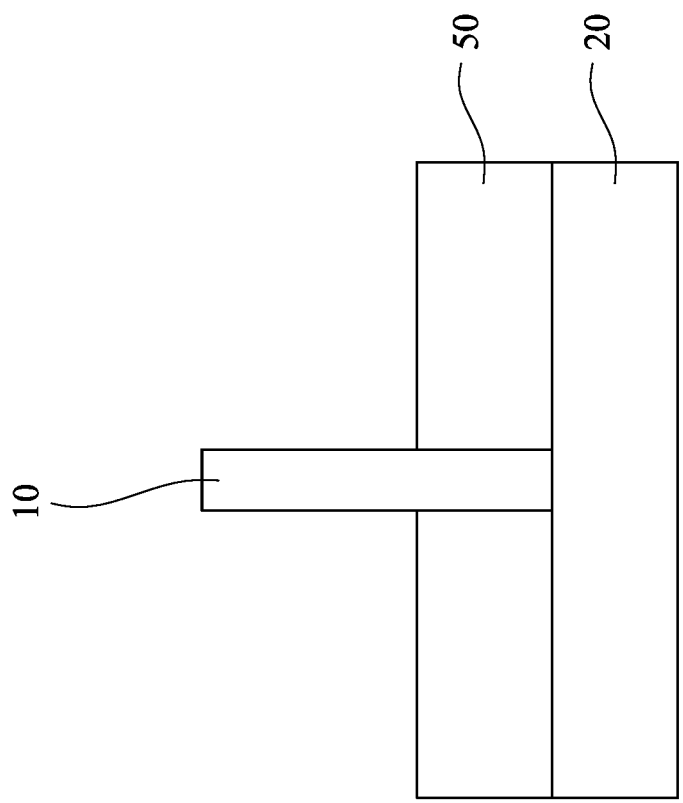

As shown in FIG. 1B, an isolating, insulating layer 50 is formed over the semiconductor structure 10. In embodiments, insulating layer 50 includes one or more layers of insulating materials such as silicon oxide, silicon oxynitride, or silicon nitride. The insulating layer 50 can be formed by any suitable methods, for example, low pressure chemical vapor deposition (LPCVD), plasma CVD, and the like.

After forming the insulating layer 50, a planarization operation is performed so as to remove part of the insulating layer 50. The planarization operation may include a chemical mechanical polishing (CMP), an etch-back process, or both.

Then, the insulating layer 50 is partially removed so that the channel region in the semiconductor structure 10 is exposed. In embodiments, the partial removal of the insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

Figure 1C:
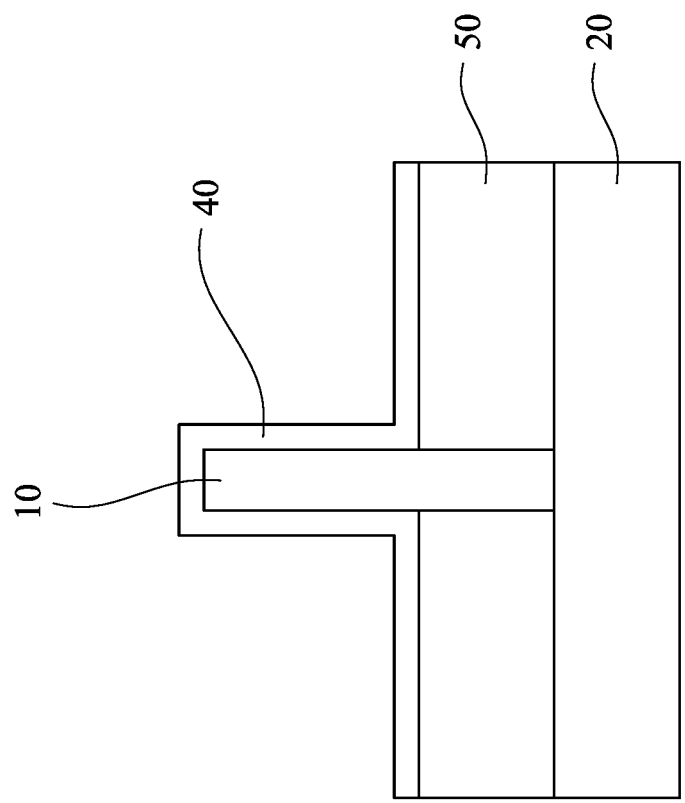

As shown in FIG. 1C, and as described in example operation 110 of FIG. 3, a germanium nitride layer 40 is formed on the semiconductor structure 10. In the embodiments, germanium nitride layer 40 abuts the semiconductor structure 10.

In embodiments, germanium nitride layer 40 is formed on at least one surface of the semiconductor structure 10. As shown in FIG. 1C, in embodiments, germanium nitride layer 40 is formed on exposed surfaces of semiconductor structure 10.

In embodiments, the germanium nitride layer 40 is more than a monolayer thick. Accordingly, embodiments of the present disclosure include a device comprising a germanium nitride layer 40 that is more than a monolayer thick on a surface of a semiconductor structure 10 that comprises germanium. Additional embodiments of the present disclosure include methods comprising forming a semiconductor structure 10 comprising germanium, and forming a germanium nitride layer 40 having a thickness that is more than a monolayer on the semiconductor structure 10.

Such embodiments provide better reliability through improved reproducibility and durability under thermal load as compared to a traditional surface passivation layer (e.g., a monolayer of germaniumoxynitride (GeON)).

Without proper surface passivation, germanium-containing nanowires and fins may suffer from high interfacial states. In embodiments, the $D_{IT}$ of an interface between the surface of the semiconductor structure 10 and germanium nitride layer 40 is no more than about $5\times10^{11}$ eV$^{-1}$ cm$^{-2}$ In embodiments, the $D_{IT}$ of an interface between the surface of the semiconductor structure 10 and germanium nitride layer 40 is less than about $5\times10^{11}$ eV$^{-1}$ cm$^{-2}$. In embodiments, the $D_{IT}$ of an interface between the surface of the semiconductor structure 10 and germanium nitride layer 40 ranges from about $1\times10^{11}$ eV$^{-1}$ cm$^{-2}$ to about $5\times10^{11}$ eV$^{-1}$ cm$^{-2}$.

In embodiments, the germanium nitride layer 40 is at least a bilayer thick. In embodiments, the germanium nitride layer 40 is more than a bilayer thick. In embodiments, the germanium nitride layer 40 is at least a trilayer thick. In embodiments, the germanium nitride layer 40 is more than a trilayer thick.

In some embodiments, a germanium nitride layer 40 is at least about 0.2 nanometers (nm) thick. In some embodiments, a germanium nitride layer 40 is at least about 0.5 nm thick. In some embodiments, a germanium nitride layer 40 is at least about 1.0 nm thick. In some embodiments, a germanium nitride layer 40 is at least about 1.5 nm thick. In some embodiments, a germanium nitride layer 40 is no more than about 2.5 nm thick. In some embodiments, a germanium nitride layer 40 is no more than about 2.0 nm thick. In some embodiments, a germanium nitride layer 40 is no more than about 1.5 nm thick. In some embodiments, the thickness of a germanium nitride layer 40 ranges from about 0.2 nm to about 2.0 nm.

In some embodiments, a germanium nitride layer 40 has a substantially uniform thickness. "Substantially uniform thickness," as used herein means that the layer has an overall thickness variation of less than ±30% from the average thickness of the layer. In embodiments, substantially uniform thickness means that the layer has an overall thickness variation of less than ±25% from the average thickness. In some embodiments, substantially uniform thickness means that the layer has an overall thickness variation of less than ±20% from the average thickness. In some embodiments, substantially uniform thickness means that the layer has an overall thickness variation of less than ±15% from the average thickness. In some embodiments, substantially uniform thickness means that the layer has an overall thickness variation of less than ±10% from the average thickness. In some embodiments, substantially uniform thickness means that the layer has an overall thickness variation of less than ±5% from the average thickness.

In embodiments, a germanium nitride layer 40 is formed using chemical vapor deposition (CVD). In some embodiments, a germanium nitride layer 40 is formed using metal-organic chemical vapor deposition (MOCVD). In such embodiments, semiconductor structure 10 is exposed to a vapor that includes germanium. In embodiments, the vapor includes one or more volatile precursors that decompose and/or react to deposit germanium nitride on the surface of semiconductor structure 10. In some embodiments, the vapor comprises $Ge_2H_6$. In some embodiments, the vapor comprises $GeH_4$.

In some embodiments, the vapor further comprises $N_2H_4$. In embodiments, the $N_2H_4$ source is anhydrous. In such embodiments, the oxygen concentration of germanium nitride layer 40 is about zero. In other words, in accordance with embodiments of the present disclosure, germanium nitride layer 40 has substantially zero oxygen impurities. In embodiments, a germanium nitride layer 40 formed using $N_2H_4$ has fewer nitrogen vacancies than a germanium nitride layer 40 formed using $NH_3$. In some such embodiments, the nitrogen vacancies are less than about $5\times10^{16}$ atoms/$cm^{-3}$. In some embodiments, the nitrogen vacancies are less than about $4\times10^{16}$ atoms/$cm^{-3}$. In certain embodiments, the vapor comprises $Ge_2H_6$ and $N_2H_4$.

In embodiments, the vapor does not comprise a precursor that contains carbon. In such embodiments, the carbon concentration of the germanium nitride layer 40 is lower than the carbon concentration of a comparable germanium nitride layer formed using a carbon containing precursor. In some embodiments, the carbon concentration of the germanium nitride layer 40 is no more than about $5\times10^{16}$ atoms/$cm^{-3}$. In some embodiments, the carbon concentration of the germanium nitride layer 40 is less than $5\times10^{16}$ atoms/$cm^{-3}$.

In some embodiments, the germanium nitride layer 40 consists essentially of germanium nitride. In such embodiments, the germanium nitride layer 40 has a carbon concentration of no more than about $5\times10^{16}$ atoms/$cm^{-3}$, and an oxygen concentration of substantially zero.

The germanium nitride layer 40 may be formed using any suitable processing parameters (e.g., flow rate, wafer temperature, pressure, deposition time, etc.). In embodiments, a component of the vapor (e.g., $Ge_2H_6$, $N_2H_4$, etc.) has a flow rate ranging from about 10 standard cubic centimeters per minute (sccm) to about 800 sccm. In embodiments, a component of the vapor has a flow rate ranging from about 20 sccm to about 800 sccm. In some embodiments, the vapor has a flow rate ranging from about 10 sccm to about 800 sccm. In some embodiments, the vapor has a flow rate ranging from about 20 sccm to about 800 sccm.

In accordance with methods of the present disclosure, a germanium nitride layer 40 is formed on a germanium-containing semiconductor structure 10 at temperatures that are sufficiently low to avoid reflow of the germanium of the semiconductor structure.

In some embodiments, a semiconductor structure 10 is exposed to the vapor with a wafer temperature that is no more than about 500° C. In some embodiments, a semiconductor structure 10 is exposed to the vapor with a wafer temperature that is less than about 500° C. In various embodiments, semiconductor structure 10 is exposed to the vapor with a wafer temperature that is no more than about 450° C. In various embodiments, semiconductor structure 10 is exposed to the vapor with a wafer temperature that is less than about 450° C. In various embodiments, semiconductor structure 10 is exposed to the vapor with a wafer temperature that is no more than about 400° C. In various embodiments, semiconductor structure 10 is exposed to the vapor with a wafer temperature that is at least about 330° C. In various embodiments, semiconductor structure 10 is exposed to the vapor with a wafer temperature that is at least about 340° C. In some embodiments, semiconductor structure 10 is exposed to the vapor with a wafer temperature ranging from about 340° C. to about 500° C. In some embodiments, semiconductor structure 10 is exposed to the vapor with a wafer temperature ranging from about 340° C. to about 450° C. In some embodiments, semiconductor structure 10 is exposed to the vapor with a wafer temperature ranging from about 440° C. to about 500° C. In some embodiments, semiconductor structure 10 is exposed to the vapor with a wafer temperature ranging from about 340° C. to about 400° C.

In embodiments, semiconductor structure 10 is exposed to the vapor at a pressure that is no more than about 300 Torr. In embodiments, semiconductor structure 10 is exposed to the vapor at a pressure that is less than about 300 Torr. In embodiments, semiconductor structure 10 is exposed to the vapor at a pressure that is no more than about 100 Torr. In embodiments, semiconductor structure 10 is exposed to the vapor at a pressure that is less than about 100 Torr. In various embodiments, semiconductor structure 10 is exposed to the vapor at a pressure that is no more than about 50 Torr. In some embodiments, semiconductor structure 10 is exposed to the vapor at a pressure that ranges from about 10 Torr to about 300 Torr. In some embodiments, semiconductor structure 10 is exposed to the vapor at a pressure that ranges from about 10 Torr to about 100 Torr. In certain embodiments, semiconductor structure 10 is exposed to the vapor at a pressure that ranges from about 10 Torr to about 50 Torr.

In embodiments, the pressure at which semiconductor structure 10 is exposed to the vapor is modulated in order to control the efficiency of the growth of germanium nitride layer 40. In such embodiments, reducing the pressure at which semiconductor structure 10 is exposed increases the efficiency of the growth of germanium nitride layer 40.

In embodiments, the deposition time for forming a germanium nitride layer 40 of the present disclosure is significantly less than the deposition time for growing a silicon cap layer at the same temperature. In embodiments, the deposition time for a germanium nitride layer 40 is less than 500 seconds. In embodiments, the deposition time for a germanium nitride layer 40 is less than 400 seconds. In embodiments, the deposition time for a germanium nitride layer 40 is less than 250 seconds. In embodiments, the deposition time for a germanium nitride layer 40 is less than 200 seconds. In embodiments, the deposition time for a germanium nitride layer 40 is less than 100 seconds.

In embodiments, the inhibition time for forming a germanium nitride layer 40 of the present disclosure is significantly less than the inhibition time for growing a silicon cap layer at the same temperature. As used herein, "inhibition time" refers to the period of time between the start of a CVD process (i.e., exposure of a semiconductor structure to a vapor) and the start of the epitaxial growth on the surface of the semiconductor structure. A lower inhibition time may result in a more uniform thickness in the layer. In embodiments, the inhibition time for growing a silicon cap layer ranges from about 10 seconds to about 30 seconds. In some embodiments, there is substantially no inhibition time for forming a germanium nitride layer 40.

Figure 1D:
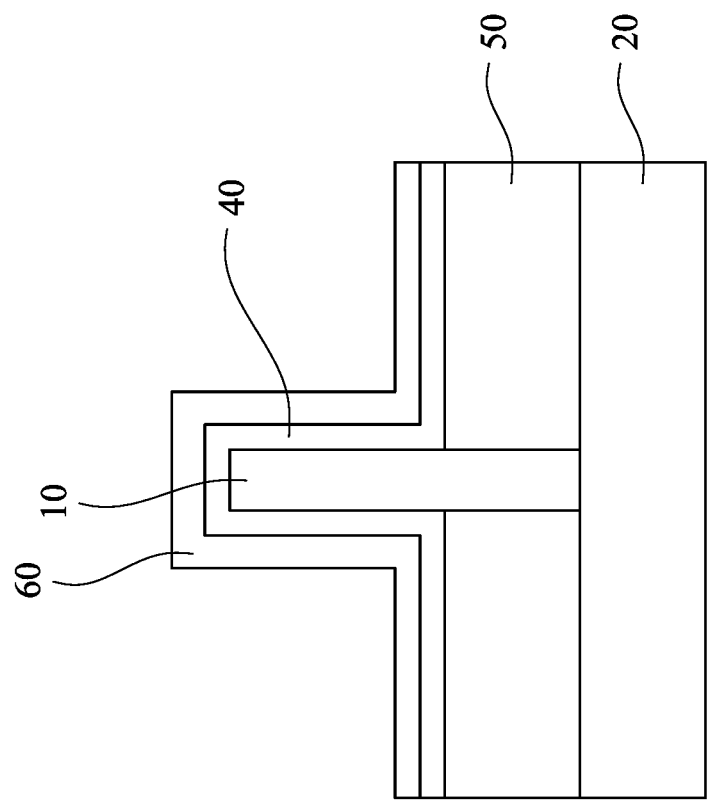

As shown in FIG. 1D, in accordance with embodiments of the present disclosure, a gate dielectric layer 60 is formed on the germanium nitride layer 40. In other words, the germanium nitride layer 40 is between the gate dielectric layer 60 and the semiconductor structure 10. In embodiments, gate dielectric layer 60 abuts germanium nitride layer 40. Gate dielectric layer 60 may be formed using any suitable method, such as atomic layer deposition (ALD) and the like.

In some embodiments, gate dielectric layer 60 is a high-k dielectric. In some embodiments, the high-k dielectric has a k value greater than about 7.0, and may include a metal oxide, nitride, or a silicate of hafnium, aluminum, zirconium, lanthanum (La), and the like. In some embodiments, the high-k dielectric comprises an oxide or nitride of hafnium, aluminum, lanthanum, lutetium (Lu), zirconium, titanium, tantalum, barium (Ba), strontium (Sr), lead (Pb), and the like. In certain embodiments, the high-k dielectric comprises hafnium oxide, zirconium oxide, or the like.

In embodiments, the gate dielectric layer 60 also includes an interfacial layer. In some embodiments, the interfacial layer is made of silicon dioxide.

Figure 1E:
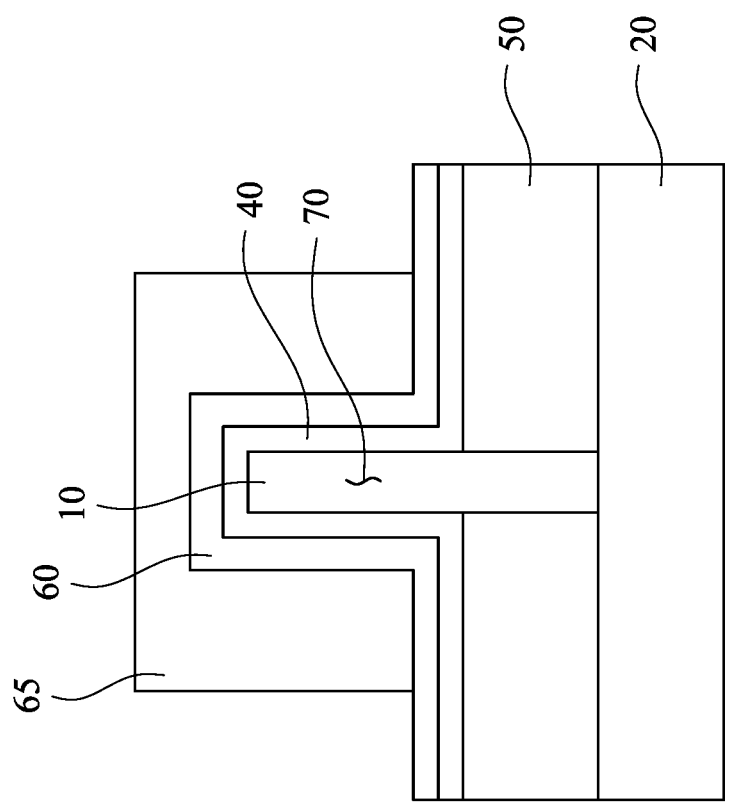

As shown in FIG. 1E, in accordance with embodiments of the present disclosure, a gate electrode 65 is formed on the gate dielectric layer 60. Any suitable method may be used to form a gate electrode 65. In various embodiments, a gate electrode 65 is formed using a conformal method. Gate electrode 65 may include Ti, Ta, tungsten (W), molybdenum (Mo), Ru, Pt, Co, Ni, Pd, niobium (Nb), Al, copper (Cu), or alloys thereof. In embodiments, gate electrode 65 includes a metal-containing material, such as titanium nitride (TiN), tantalum carbide (TaC), tantalum nitride (TaN), tantalum aluminum carbide (TaAlC), titanium carbide (TiC), Co, Al, titanium aluminide (TiAl), HfTi, titanium silicide (TiSi), tantalum silicide (TaSi), or titanium aluminum carbide (TiAlC).

In some embodiments, gate electrode 65 includes more than one layer of a metal, a metal alloy, a metal-containing material, or a combination thereof. In various embodiments, gate electrode 65 includes a work function metal layer. In some embodiments, work function metal layer includes one or more layers of metal materials, such as TiN, TaN, TaAlC, TiC, TaC, Co, Al, TiAl, HfTi, TiSi, TaSi, or TiAlC.

In embodiments, a channel region 70 is formed in a portion of semiconductor structure 10. In various embodiments, the germanium nitride layer 40 is on the channel region 70 of the transistor. In embodiments, such as the embodiment shown in 1E, the portion of semiconductor structure 10 on which germanium nitride layer 40 is formed is the channel region 70.

Accordingly, embodiments of the present disclosure include a device comprising a substrate 20, a semiconductor structure 10 comprising germanium, a channel region 70 in the semiconductor structure 10, and a germanium nitride layer 40 on the channel region 70, the germanium nitride layer 40 having a thickness that is more than a monolayer. Additional embodiments of the present disclosure include methods comprising forming a germanium nitride layer 40 having a thickness that is more than a monolayer on a channel region 70 in a semiconductor structure 10 that comprises germanium.

Figure 2A:
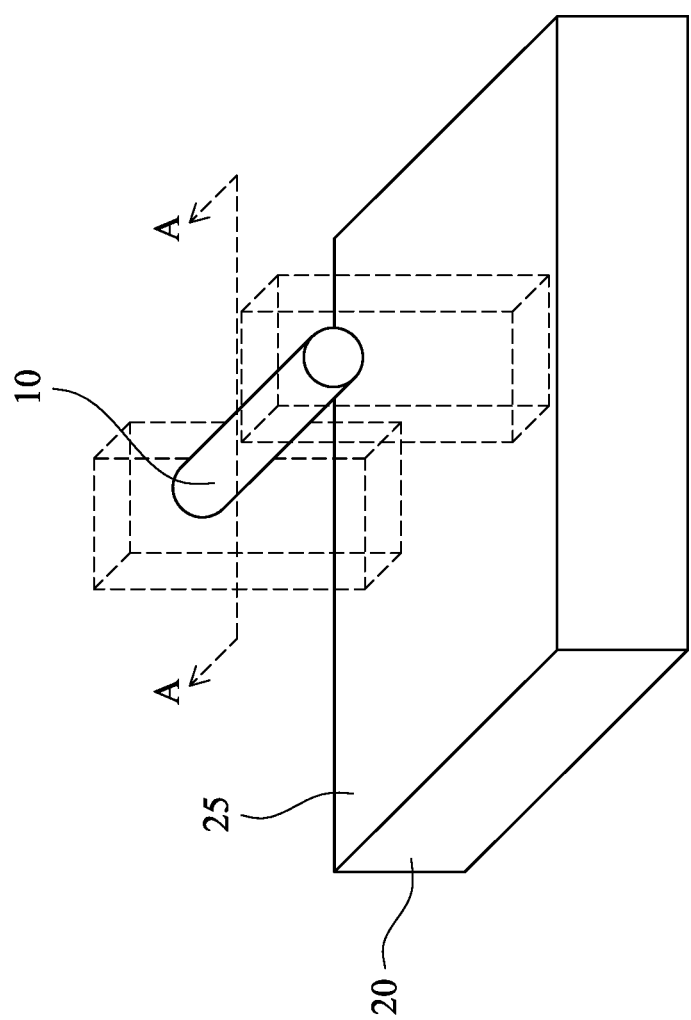
FIGS. 2A-2G illustrate a method for forming a germanium nitride layer on a semiconductor structure, in accordance with some embodiments.
Figure 2B:
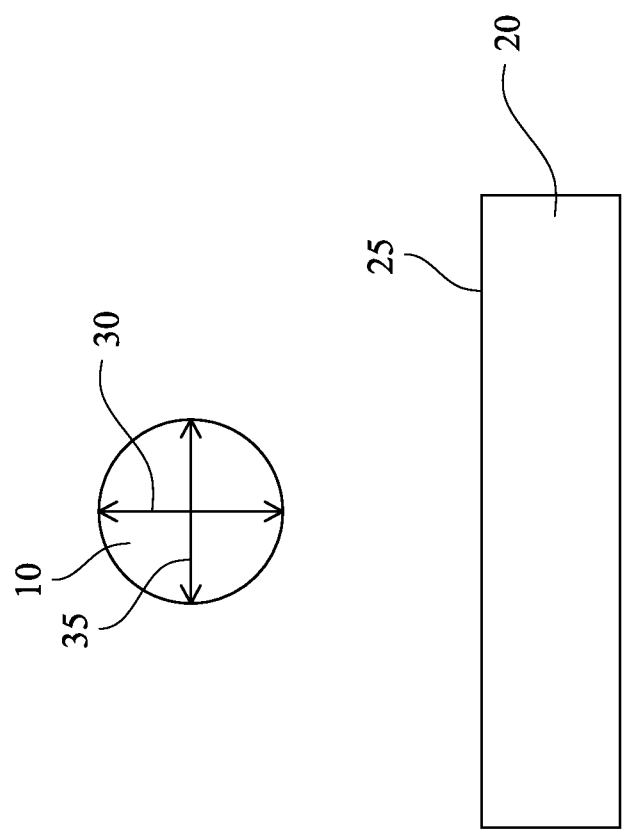
Figure 2C:
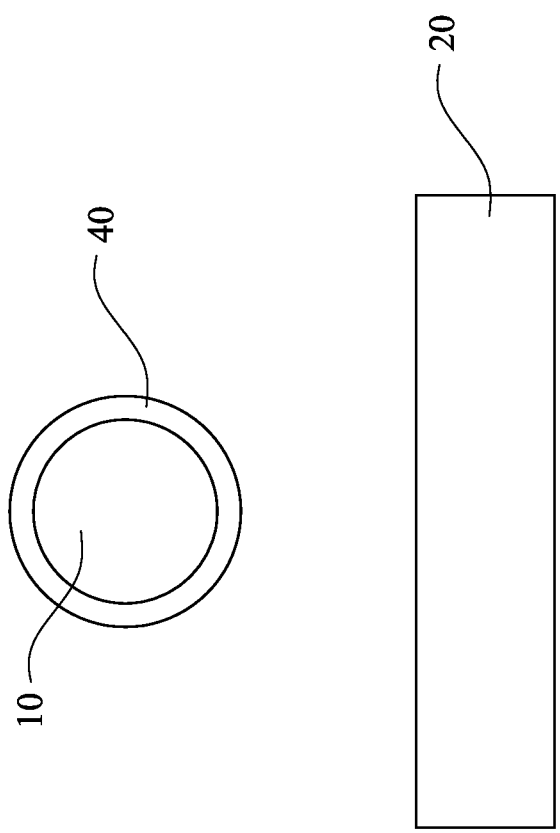
Figure 2D:
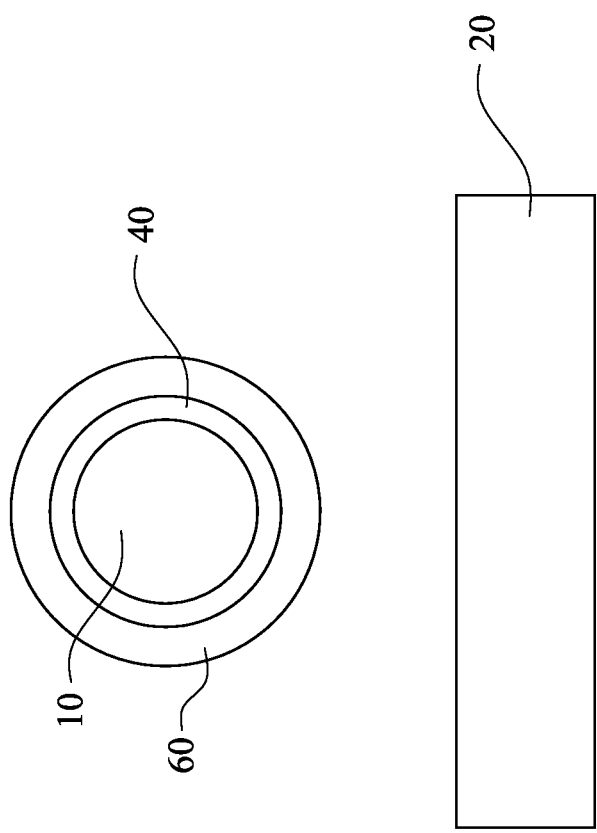
Figure 2E:
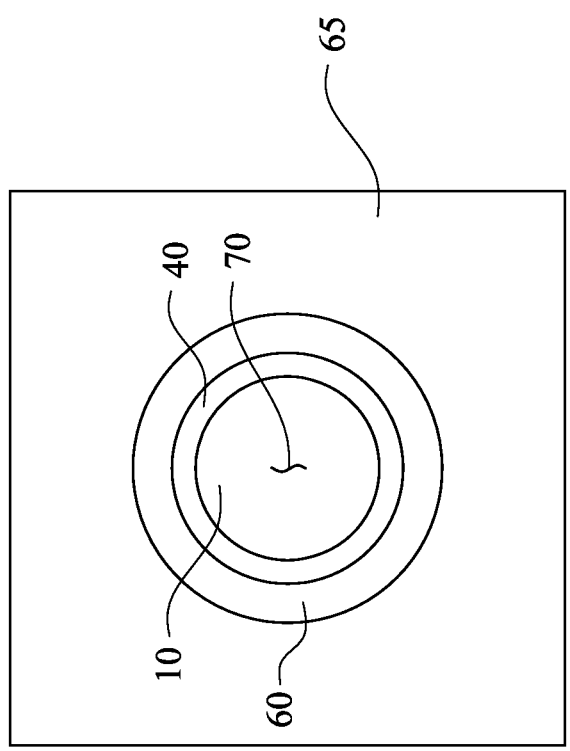
Figure 2F:
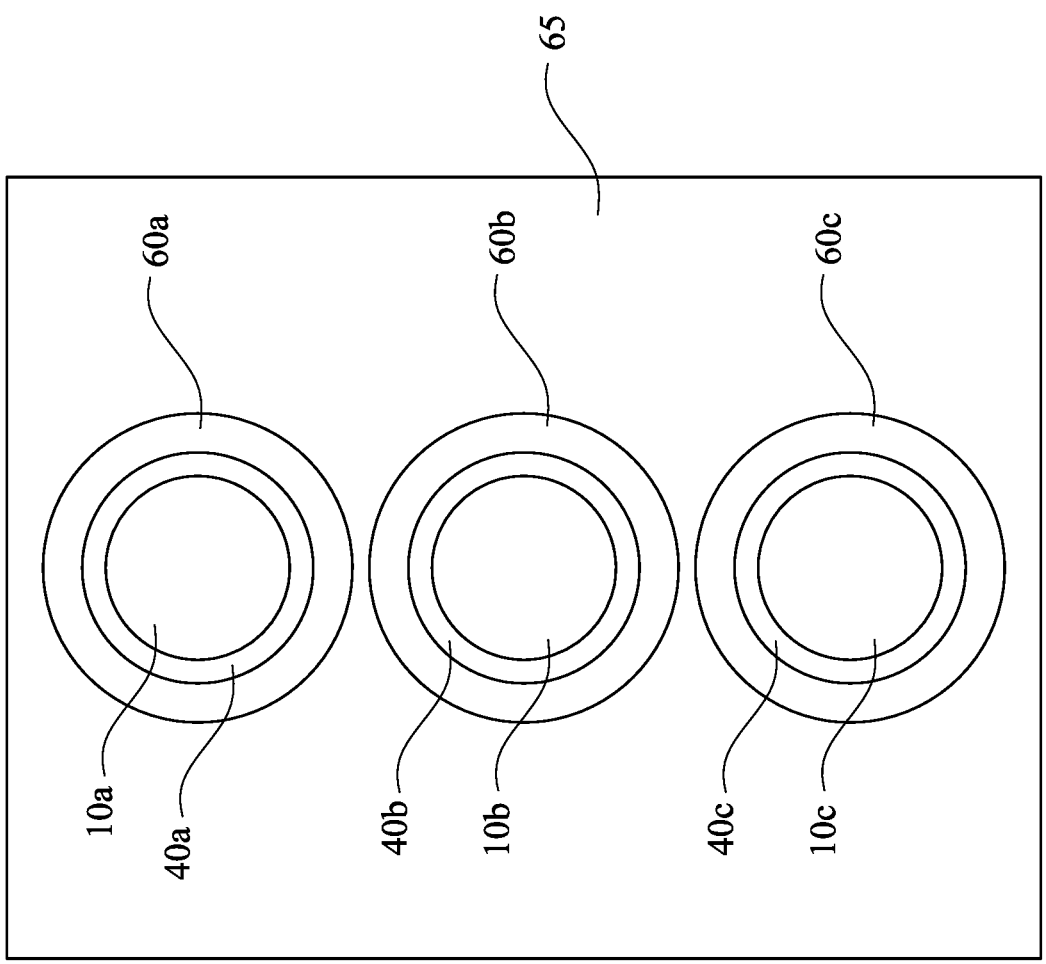
Figure 2G:
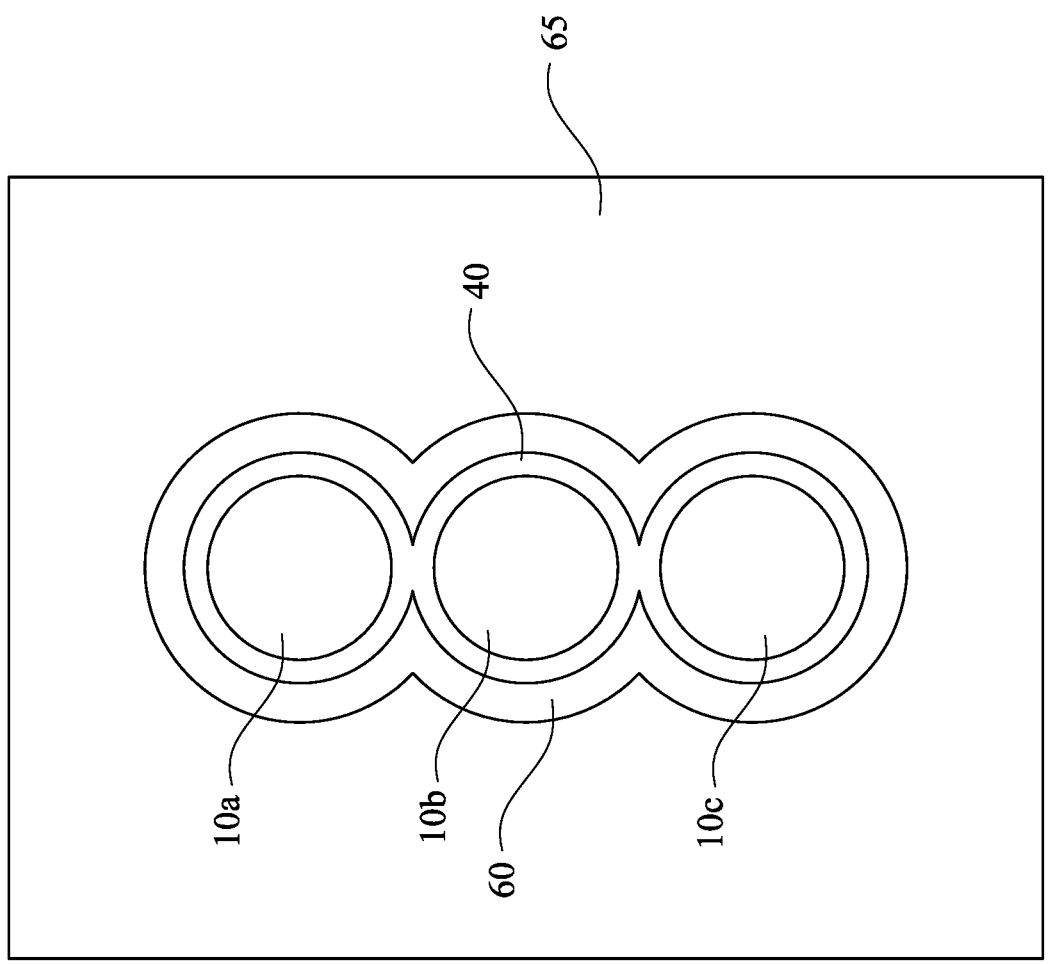

FIGS. 2A-2G illustrate steps of a method of the disclosure, in accordance with some embodiments of the present disclosure. FIGS. 2A-2E illustrate steps of a method of forming the structure of FIG. 2E as a cross sectional view along the line A-A indicated in FIG. 2A, in accordance with some embodiments of the present disclosure. FIGS. 2F and 2G are illustrations of two embodiments of the present disclosure that include multiple semiconductor structures.

Semiconductor structure 10 (e.g., a nanowire or a fin) including germanium is formed, as shown in FIG. 2A, and as described above with regard to FIG. 1A. As shown in FIG. 2A, semiconductor structure 10 is a nanowire, in some embodiments.

In embodiments, a semiconductor structure 10 is formed on a substrate 20. In some embodiments, a semiconductor substrate 10 is spaced apart from a surface 25 of the substrate 20, as shown in FIG. 2A.

In some embodiments, a semiconductor structure 10 is a horizontal semiconductor structure, i.e., a semiconductor structure that has a height 30 that is substantially equal to or less than the width 35 of the semiconductor structure 10, as shown in FIG. 2B, which shows a cross-sectional view along line A-A of FIG. 2A. "Substantially," as used herein means that the height 30 of a semiconductor structure 10 is within ±30% of the width 35 of the semiconductor structure 10. In embodiments, substantially means that the height 30 of a semiconductor structure 10 is within ±25% of the width 35 of the semiconductor structure 10. In embodiments, substantially means that the height 30 of a semiconductor structure 10 is within ±20% of the width 35 of the semiconductor structure 10. In embodiments, substantially means that the height 30 of a semiconductor structure 10 is within ±15% of the width 35 of the semiconductor structure 10. In embodiments, substantially means that the height 30 of a semiconductor structure 10 is within ±10% of the width 35 of the semiconductor structure 10. In embodiments, substantially means that the height 30 of a semiconductor structure 10 is within ±5% of the width 35 of the semiconductor structure 10.

In some such embodiments, a horizontal semiconductor structure is a horizontal nanowire or horizontal semiconductor strip. In other embodiments, a horizontal semiconductor structure is a fin.

In various embodiments, more than one semiconductor structure 10 is present. For example, multiple horizontal nanowires may be included in a stacked configuration, as shown in FIGS. 2F and 2G. In some embodiments, a second horizontal nanowire is formed over, and aligned with, a first horizontal nanowire on a substrate. In certain embodiments, a third horizontal nanowire is formed over, and aligned with, the second horizontal nanowire. In other embodiments, the multiple horizontal nanowires are not arranged in a stacked configuration. For example, the second horizontal nanowire is formed laterally adjacent to and aligned with, a first nanowire on a substrate. In certain embodiments, a third horizontal nanowire is formed laterally adjacent to and aligned with, the second horizontal nanowire.

Germanium nitride layer 40 is then formed on semiconductor structure 10 using methods of the present disclosure, as shown in FIG. 2C and as described above with regard to FIG. 1C. Such methods may have significantly less than the inhibition time than methods for growing a silicon cap layer at the same temperature, and produce a germanium nitride layer 40 that is more than a monolayer thick, and may have a substantially uniform thickness. Methods of the present disclosure can be used to form a germanium nitride layer 40 with low levels of contamination, including low levels of carbon contamination, oxygen contamination, or both, as well as low levels of nitrogen vacancies. Such a germanium nitride layer 40 may be more reliable due to an increase in reproducibility and durability under thermal load as compared to a traditional surface passivation layer.

As shown in FIG. 2C, in embodiments, the germanium nitride layer 40 is formed on the exposed surface of the semiconductor structure 10. In some embodiments, germanium nitride layer 40 surrounds the semiconductor structure 10. In some embodiments, the germanium nitride layer 40 is arranged between the semiconductor structure 10 and the substrate 20.

In some embodiments where more than one semiconductor structure 10 is present, a germanium nitride layer 40 is formed on at least one of the semiconductor structures 10. In some such embodiments, a germanium nitride layer is formed on a subset of the semiconductor structures. In other embodiments, a germanium nitride layer is formed on each of the semiconductor structures, as shown in FIGS. 2F and 2G. In various embodiments, a germanium nitride layer is between a first semiconductor structure and a second semiconductor structure.

In embodiments, semiconductor structure 10 includes a channel region 70. In various embodiments, the germanium nitride layer 40 is on the channel region 70. In embodiments, such as the embodiment shown in FIG. 2E, the portion of semiconductor structure 10 around which germanium nitride layer 40 is formed is the channel region 70.

In some embodiments, the germanium nitride layer 40 surrounds channel region 70. In other words, germanium nitride layer 40 wraps around channel region 70 in semiconductor structure 10. In some embodiments, the germanium nitride layer 40 is arranged between the channel region 70 and the substrate 20.

The gate structure can then be formed in accordance with embodiments of the disclosure. In embodiments, gate dielectric layer 60 is formed on germanium nitride layer 40, as shown in FIG. 2D, and as described above with regard to FIG. 1D. In some embodiments, a gate dielectric layer 60 surrounds germanium nitride layer 40. In some embodiments, the gate dielectric layer 60 is arranged between the semiconductor structure 10 and the substrate 20. In some embodiments, the gate dielectric layer 60 is arranged between the channel region 70 and the substrate 20.

In embodiments, a gate electrode 65 is formed on gate dielectric layer 60, as shown in FIG. 2E, and as described above with regard to FIG. 1E. In various embodiments, gate electrode 65 surrounds the gate dielectric layer 60. In some embodiments, the gate electrode 65 is arranged between the semiconductor structure 10 and the substrate 20. In some embodiments, the gate electrode 65 is arranged between the channel region 70 and the substrate 20.

In some embodiments, the germanium nitride layer 40 and semiconductor structure 10 are part of a vertical or horizontal gate all around (GAA) structure, as shown in FIGS. 2E and 2F. The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In embodiments, a device in accordance with the present disclosure comprises a germanium nitride layer on a semiconductor structure as described herein. In embodiments, the germanium nitride layer and semiconductor structure are part of a vertical tunneling field effect transistor (TFET), a finFET, a horizontal nanowire FET, a vertical nanowire FET or the like.

In various embodiments, a device of the present disclosure is a finFET. In other embodiments, a device of the present disclosure is a nanowire FET. In some embodiments, a device of the present disclosure is a horizontal nanowire FET. In some embodiments, a device of the present disclosure is a vertical nanowire FET. An embodiment of a nanowire FET according to some embodiments of the disclosure is illustrated in FIGS. 2E-2G.

The present disclosure provides, in various embodiments, a device that includes a semiconductor structure that is on a substrate and includes germanium, where a layer of germanium nitride that is more than a monolayer thick is on the semiconductor structure.

Embodiments of the present disclosure further include a device that includes a germanium nitride layer that is more than a monolayer thick on a channel region in a semiconductor structure arranged on a substrate.

The present disclosure also provides, in various embodiments, a device that includes a germanium nanowire on a substrate, where a germanium nitride layer that is more than a monolayer thick surrounds a channel formed in the germanium nanowire.

Embodiments of the present disclosure also include a device that includes a germanium fin structure formed on a substrate, where a germanium nitride layer that is more than a monolayer thick is formed over a channel formed in the germanium fin structure.

Embodiments of the present disclosure further include a method of forming a layer of germanium nitride that is more than a monolayer thick on a semiconductor structure that includes germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor device, the method comprising:
   forming a germanium semiconductor region on a substrate;
   exposing the germanium semiconductor region to a first compound comprising germanium atoms and hydrogen atoms to form a germanium nitride layer;
   forming a first dielectric layer over the germanium nitride layer; and
   forming a gate electrode over the first dielectric layer.

2. The method of claim 1, wherein the first compound comprises $Ge_2H_6$ or $GeH_4$.

3. The method of claim 2, wherein exposing the germanium semiconductor region further comprises exposing the germanium semiconductor region to $N_2H_4$.

4. The method of claim 3, wherein a source for the $N_2H_4$ is anhydrous.

5. The method of claim 1, wherein the germanium nitride layer has a substantially uniform thickness.

6. The method of claim 1, wherein during the exposing a wafer temperature is less than 340° C. to about 500° C.

7. The method of claim 1, wherein the exposing is performed at a pressure of 10 Torr to 100 Torr.

8. The method of claim 1, wherein a flow rate of the first compound is from 10 sccm to 800 sccm.

9. The method of claim 1, wherein the germanium semiconductor region comprises a fin structure.

10. The method of claim 1, wherein the germanium semiconductor region comprises a nano structure.

11. The method of claim 10, wherein the gate electrode extends completely around the nano structure in a cross-sectional view, wherein the germanium nitride layer completely separates the gate electrode from the nano structure.

12. A method of forming a semiconductor device, the method comprising:
    forming a semiconductor region on a substrate;
    forming a germanium nitride layer on the semiconductor region by exposing the semiconductor region to a vapor, wherein the vapor comprises a germanium-hydrogen compound;
    forming a first dielectric layer over the germanium nitride layer; and
    forming a gate electrode over the first dielectric layer.

13. The method of claim 12, wherein the germanium nitride layer comprises carbon, wherein a carbon concentration of the germanium nitride layer is less than $5 \times 10^{16}$ atoms/cm$^{-3}$.

14. The method of claim 13, wherein the germanium nitride layer has an oxygen concentration of substantially zero.

15. The method of claim 13, wherein the semiconductor region comprises a fin structure, wherein the gate electrode extends over an upper surface and sidewalls of the fin structure.

16. The method of claim 13, wherein the semiconductor region comprises a nanowire, wherein the gate electrode extends completely around the nanowire.

17. A method of forming a semiconductor device, the method comprising:
    forming a first fin structure, the first fin structure comprising a channel region, the channel region comprising a germanium-containing material;
    forming a first germanium nitride layer over the first fin structure by exposing the channel region to a nitrogen-containing vapor;
    forming a first dielectric layer over the first germanium nitride layer; and
    forming a gate electrode over the first dielectric layer.

18. The method of claim 17, further comprising forming isolation regions along opposing sides of the first fin structure, wherein the first germanium nitride layer extends over an upper surface of the isolation regions.

19. The method of claim 18, wherein the first germanium nitride layer extends between the gate electrode and the isolation regions.

20. The method of claim 17, wherein the nitrogen-containing vapor comprises $N_2H_4$.

21. The method of claim 17, wherein a flow rate of a component of the nitrogen-containing vapor is 20 sccm to 800 sccm.

* * * * *